United States Patent
Dolzer et al.

(10) Patent No.: US 10,969,835 B2
(45) Date of Patent: Apr. 6, 2021

(54) COOLING ARRANGEMENT AND AIR GUIDE SHROUD

(71) Applicant: FUJITSU LIMITED

(72) Inventors: Herbert Dolzer, Munich (DE); Roland Treffler, Munich (DE); Lorenz Schelshorn, Munich (DE)

(73) Assignee: FUJITSU LIMITED, Kawasaki (JP)

( * ) Notice: Subject to any disclaimer, the term of this patent is extended or adjusted under 35 U.S.C. 154(b) by 336 days.

(21) Appl. No.: 15/964,154

(22) Filed: Apr. 27, 2018

(65) Prior Publication Data

US 2018/0314305 A1 Nov. 1, 2018

(30) Foreign Application Priority Data

Apr. 28, 2017 (DE) .......................... 102017109201.3

(51) Int. Cl.
 *G06F 1/20* (2006.01)
 *H05K 7/20* (2006.01)
 *H05K 1/02* (2006.01)

(52) U.S. Cl.
 CPC ............. *G06F 1/20* (2013.01); *H05K 1/0203* (2013.01); *H05K 7/20145* (2013.01); *H05K 7/20172* (2013.01); *G06F 2200/201* (2013.01)

(58) Field of Classification Search
 CPC ...... G06F 1/20; G06F 2200/201; G06F 30/18; H05K 1/0203; H05K 7/20145; H05K 7/20172; H05K 7/20
 USPC ....................................................... 454/184
 See application file for complete search history.

(56) References Cited

U.S. PATENT DOCUMENTS

| 7,369,406 B2 * | 5/2008 | Matsushima .......... G11B 33/12 361/679.48 |
| 7,782,615 B1 | 8/2010 | Hao-Der et al. |
| 2012/0134113 A1 | 5/2012 | Lai |
| 2014/0133086 A1 | 5/2014 | Chen et al. |

FOREIGN PATENT DOCUMENTS

CN          103793030          5/2014

OTHER PUBLICATIONS

GBSR—Search Report issued for GB Application No. GB1806852. 8, dated Aug. 23, 2018.

* cited by examiner

*Primary Examiner* — Kenneth J Hansen
*Assistant Examiner* — Ryan L Faukner
(74) *Attorney, Agent, or Firm* — Fujitsu Patent Center

(57) ABSTRACT

The invention relates to a cooling arrangement, in particular for a computer system, including at least one fan for generating a cooling air stream. The cooling arrangement further includes at least one first element to be cooled arranged in a first region and at least one second element to be cooled arranged in a second region. Furthermore, the cooling arrangement includes an air guide element formed with an internal isolation channel. The air guide element is formed in such a way as to divide the cooling air stream into a first air stream through the first region and a second air stream through the second region and to at least partially isolate the first air stream from the second air stream by the air guide element.

Figure 1:
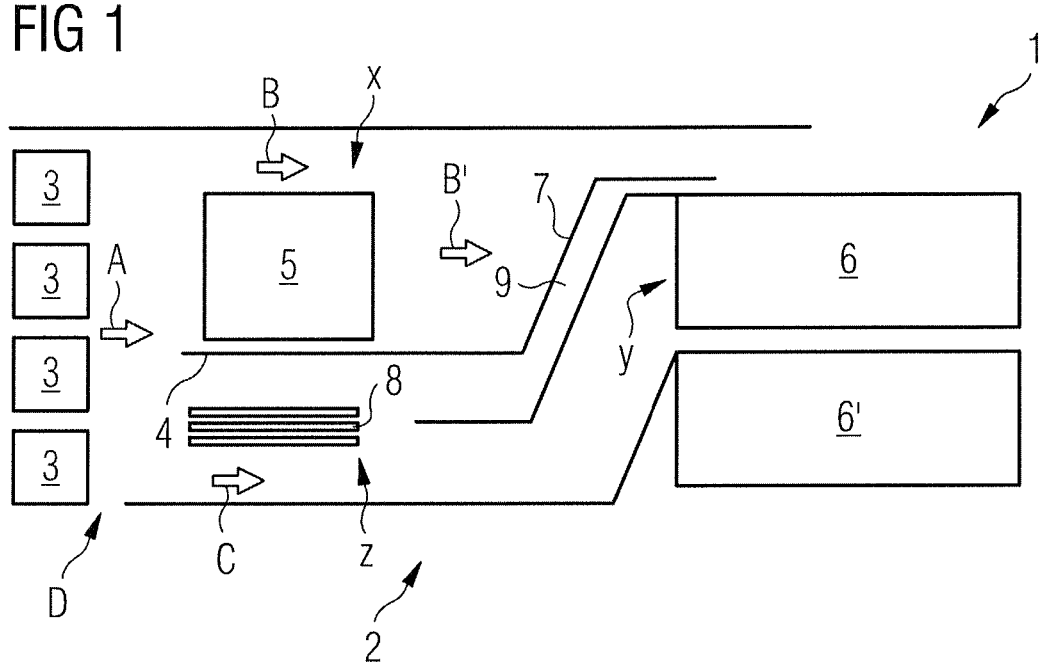

Furthermore, the invention relates to an air guide shroud which is suitable for such a cooling arrangement.

12 Claims, 1 Drawing Sheet

COOLING ARRANGEMENT AND AIR GUIDE SHROUD

The present invention relates to a cooling arrangement, in particular for a computer system, including at least one fan for generating a cooling air stream and an air guide element. The invention further relates to an air guide shroud including an air guide element.

Cooling arrangements having air guide elements and at least one fan for generating a cooling air stream are known. In such cooling arrangements, the air guide elements are used to guide the cooling air stream generated by the at least one fan in a desired direction. In this way, the cooling air stream reaches components to be cooled in a targeted manner. Air guide shrouds having such air guide elements are also known.

An object of the present invention is to provide an improved cooling arrangement and air guide shroud.

According to a first aspect of the invention, the above-mentioned object is achieved by a cooling arrangement described above. The cooling arrangement further includes at least one first element to be cooled arranged in a first region, and at least one second element to be cooled arranged in a second region. The air guide element comprises an internal isolation channel and is configured in such a way as to divide the cooling air stream into a first air stream through the first region and a second air stream through the second region. The isolation channel at least partially isolates the first air stream from the second air stream. An advantage of such a cooling arrangement is that a through-flow of the first air stream into the second region, respectively of the second air stream into the first region, is at least partially prevented by the isolation channel. Such a through-flow is reduced by the isolation channel in particular in cases where leaks exist between the air guide element and a system board, on which such an air guide element is arranged.

In at least one embodiment of the invention, the air guide element at least partially isolates heated exhaust air of the at least one first element to be cooled from a cooling air for the at least one second element to be cooled arranged downstream with respect to the first air stream. An advantage of this configuration is that a heat-up of the air guide element through the heated exhaust air of the at least one first element to be cooled is at least partially prevented by the isolation channel. In this way, the heat of the heated exhaust air is not significantly transferred via the air guide element to the cooling air for the at least one second element to be cooled.

In at least one embodiment, a third air stream runs through the isolation channel. An advantage of this configuration is that the third air stream actively cools the air guide element.

In at least one embodiment of the invention, a width of the isolation channel decreases in the direction of the third air stream. An advantage of this configuration is that an air pressure in the isolation channel is increased. In this way, a through-flow of the first air stream into the second region, respectively of the second air stream into the first region, in particular at leaks of the air guide element, for example, is additionally suppressed.

According to a second aspect of the invention, the above-mentioned object is achieved by an air guide shroud having an air guide element. The air guide shroud further includes an inlet region for a cooling air stream, a first cavity for guiding a first air stream, and a second cavity for guiding a second air stream. The first cavity and the second cavity are connected with the inlet region. The air guide element is arranged between the first cavity and the second cavity and formed with an internal isolation channel.

Further advantageous embodiments are disclosed in the appended claims as well as in the following description of exemplary embodiments. The exemplary embodiments are described with reference to the attached figures. Elements having basically the same function are indicated with the same reference characters throughout the figures, but these elements do not have to be identical in every detail.

Figure 2:
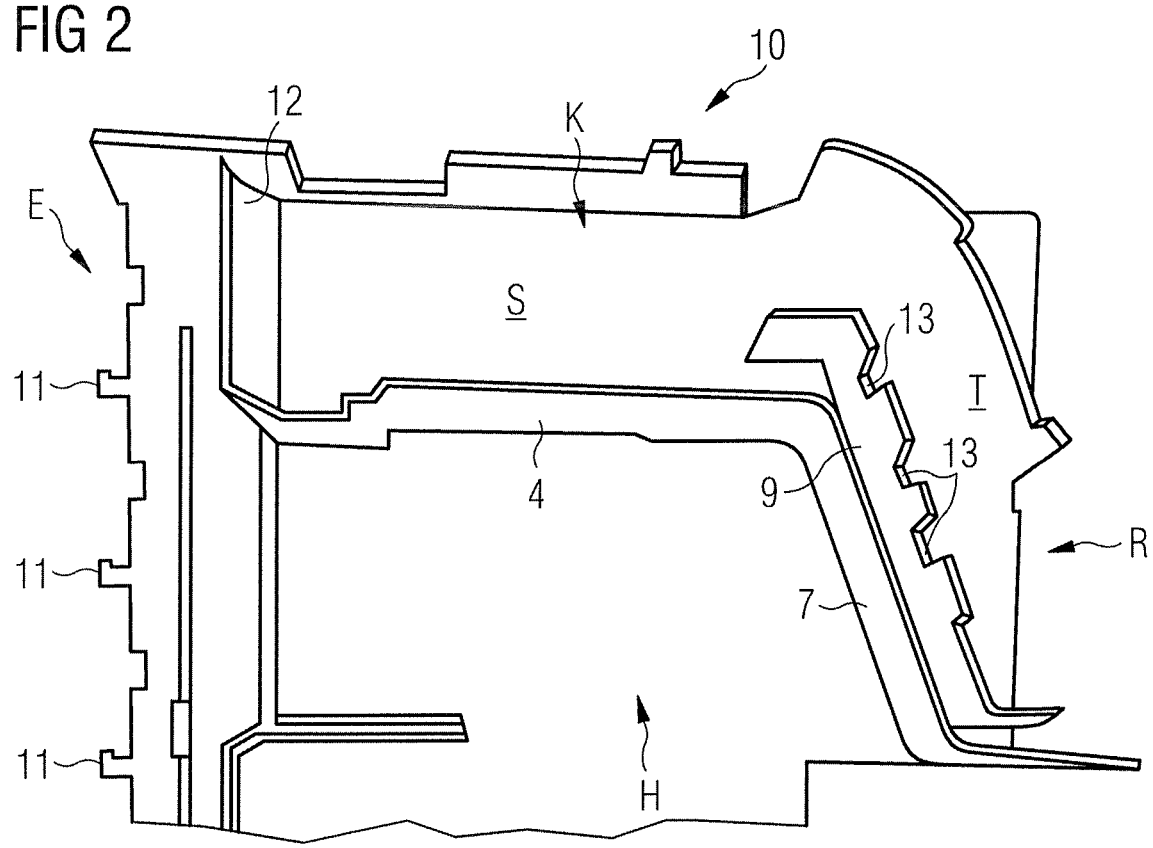

The figures show in:

FIG. 1 a schematic view of a cooling arrangement according to an embodiment of the invention, FIG. 2 a part of an air guide shroud according to an embodiment of the invention.

FIG. 1 shows a schematic illustration of a cooling arrangement 1 for a computer system 2 according to an embodiment of the invention. In this case, the computer system 2 is a so-called rack server. Four system fans 3 are located on an inlet side D of the cooling arrangement 1. The system fans 3 generate a cooling air stream in the direction of an arrow A. The cooling air stream in the direction of the arrow A is used to cool heat-generating components of the computer system 2.

In the cooling arrangement 1, the cooling air stream is divided into two air streams by a wall 4 serving as an air guide element at the inlet side D. A first air stream in the direction of an arrow B and a second air stream in a direction of an arrow C. The wall 4 extends parallel to the flow direction of the cooling air stream in the direction of the arrow A.

The first air stream in the direction of the arrow B serves to cool a processor 5 in a first region X. This first region X is located on a first side of the wall 4. The air of the first air stream is heated by the processor 5 and exits the first region X as heated exhaust air in the direction of an arrow B'.

The second air stream is guided in such a way that it cools a power supply unit 6 in a second region Y. The second region Y is located downstream in the direction of the arrows A, B and B' behind the first region X. The heated exhaust air of the processor 5 is too hot to sufficiently cool the power supply unit 6. Efficiency of the power supply unit 6 significantly depends on the temperature of the power supply unit 6. Thus, sufficient cooling of the power supply unit 6 is an important factor for efficiency and power consumption of the computer system 2.

In order to separate the heated exhaust air in the direction of the arrow B' from the second air stream to cool the power supply unit 6, a double wall 7 is arranged between the first region X and the second region Y. The double wall 7 forms a cavity, which serves as an isolation channel 9. A wall, of the double wall 7, that faces the first region X, extends all the way to the inlet side D and merges into the wall 4 that divides the cooling air stream into the first and the second air stream. The double wall 7 does not extend parallel to the direction of the arrow A in this exemplary embodiment. The double wall 7 includes an angle with respect to the wall 4 in the direction of the first region X, since the second region Y is located behind the first region X in the direction of arrow A.

The second air stream passes a third region Z in order to get into the second region Y. The third region Z is located laterally adjacent to the first region X in the direction of the cooling air stream. The wall 4 separates the first region X from the third region Z. In this exemplary embodiment, storage modules 8 are located in the third region Z, which are also cooled by the second air stream in the direction of the arrow C. The storage modules 8, however, generate less heat than the processor 5, so that an exhaust air heated by the storage modules 8 is sufficiently cold to cool the power supply unit 6.

The isolation channel 9 serves to prevent a through-flow of the heated exhaust air of the processor 5 impinging on the double wall 7 into the second region Y. The isolation channel 9 also serves as a heat insulation between the first region X to be cooled and the second region Y to be cooled. This heat insulation reduces a heat transfer from the first region X to the second region Y via the double wall 7 itself. The double wall 7 is actively cooled, in that a third air stream runs through the isolation channel 9. In this exemplary embodiment, the third air stream is branched-off from the second air stream after the second air stream cooled the storage modules 8.

A width of the isolation channel 9 in the double wall 7 decreases in the direction of the third air stream. This causes an increased air pressure in the isolation channel 9, which additionally prevents a through-flow of the first air stream into the second region. Such a through-flow of the first air flow into the second region in particular occurs if the air guide element and the elements to be cooled 5, 6 and 8 are arranged on an uneven board. Through leaks between the board and the air guide element, the heated exhaust air can spread to the second region Y in the direction of the arrow B' without isolation channel 9.

With respect to the direction of the arrow A, a further power supply unit 6', which enables a redundant power supply of the computer system 1, for example, is located laterally adjacent the power supply unit 6, downstream behind the third region Z. In this exemplary embodiment, the further power supply unit 6' suctions air for cooling outside the regions X, Y and Z.

FIG. 2 shows a part of an air guide shroud 10 according to an embodiment of the invention, as can be used, for example, for a cooling arrangement 1 according to FIG. 1. FIG. 2 shows the air guide shroud 10 from below. In the case that the air guide shroud 10 of FIG. 2 is mounted in a computer system on a system board, the discernable side of the air guide shroud 10 faces the system board, on which the components 5 and 8 to be cooled are mounted.

The air guide shroud 10 comprises an inlet region E on one side. On an outer edge of the inlet region E, the air guide shroud 10 comprises attachment hooks 11, by means of which the air guide shroud 10 can be attached to a system fan bridge of a computer system. The inlet region E serves as an inlet for a cooling air stream.

A first cavity H and a second cavity K adjoin the inlet region E. The cavities H, K are separated from one another by an air guide element. The second cavity K comprises a first channel region S and a second channel region T. The first channel region S is adjacent to the first cavity H and is configured in such a way that a first air stream through the first cavity H runs in parallel to a second air stream through the first channel region S. The second channel region T is located on a side of the first cavity H facing away from the inlet region E, behind the first cavity H. Furthermore, the second channel region is arranged in such a way that the second air stream through the second cavity K in the second channel region T includes an angle of approximately 70° with respect to the first channel region S in the direction of the first cavity H.

Between the first cavity H and the second channel region T of the second cavity K, the air guide element is formed as a double wall 7, so that an isolation channel 9 separates the first cavity H from the second channel region T. Between the first channel region S and the first cavity H, the air guide element is formed as a simple wall 4.

The air guide element extends on an end of the simple wall 4 facing away from the isolation channel 9 all the way to the inlet region E of the air guide shroud 10. The air guide element partially separates the inlet region E from the first channel region S. Between the inlet region E and the first channel region S, the air guide element is formed as a half-height wall 12, so that the air guide element in this region only permits part of the cooling air stream to flow from the inlet region E into the second cavity K. A major part of the cooling air stream is guided by the half-height wall 12 into the first cavity H. In this exemplary embodiment, the half-height wall 12, the simple wall 4 and the wall of the double wall 7 facing the first cavity H merge into one another and constitute a contiguous air guide element.

In this exemplary embodiment, the wall of the isolation channel 9, which faces the second channel region T, comprises recesses 13. These recesses 13 are arranged in such a way that components such as transistors on the system board, over which the air guide shroud 10 is attached, have sufficient space. The air guide shroud 10 is attached on a system board of a computer system 1 in accordance with FIG. 1 in such a way that, in the first cavity H, e.g. a processor is attached on the board, memory modules are attached in the first channel region S of the second cavity K, and a power supply unit follows at an outlet region R of the second channel region T.

In this embodiment, the air guide shroud 10 has a height of shortly less than one height unit, so that the air guide shroud 10 can be used in a computer system having a total height of one height unit.

LIST OF REFERENCE CHARACTERS

1 Cooling arrangement
2 Computer system
3 System fan
4 Wall
5 Processor
6, 6' Power supply unit
7 Double wall
8 Memory module
9 Isolation channel
10 Air guide shroud
11 Attachment hook
12 Half-height wall
13 Recess
X First region
Y Second region
Z Third region
D Inlet side
E Inlet region
H First cavity
K Second cavity
S First channel region
T Second channel region
R Outlet region
A, B, B', C Arrow

The invention claimed is:

1. A cooling arrangement including
at least one fan for generating a cooling air stream,
at least one first element to be cooled arranged in a first region and at least one second element to be cooled arranged in a second region and an air guide element formed with an internal isolation channel, wherein the internal isolation channel is arranged between the first region and the second region, the internal isolation chamber separates the first region from the second region, the air guide element is formed in such a way as to divide the cooling air stream into a first air stream through the first region and a second air stream through the second region and to at least partially isolate the first air stream from the second air stream by the internal isolation channel and wherein the second region is located downstream behind the first region in the direction of the first air stream and a third region is arranged adjacent to the first region, and the second air stream flows through the third region into the second region.

2. The cooling arrangement according to claim 1,
wherein the air guide element at least partially isolates heated exhaust air of the at least one first element to be cooled from a cooling air for the at least one second element to be cooled, which is arranged downstream with respect to the first air stream.

3. The cooling arrangement according to claim 1,
wherein the air guide element includes a portion without the internal isolation channel, and the portion without the internal isolation channel extends between the first region and the third region.

4. The cooling arrangement according to claim 1,
wherein at least one third element to be cooled is arranged in the third region, and a heat generated by the at least one third element to be cooled is less than a heat generated by the at least one first element to be cooled.

5. The cooling arrangement according to claim 1,
wherein a third air stream flows through the internal isolation channel.

6. The cooling arrangement according to claim 5,
wherein a width of the internal isolation channel decreases in the direction of the third air stream.

7. The cooling arrangement according to claim 5,
wherein the air guide element is formed in such a way that the third air stream is branched-off from the second air stream.

8. The cooling arrangement according to claim 1,
wherein the first element to be cooled includes a processor and the second element to be cooled includes a power supply module of a computer system.

9. An air guide shroud including
an inlet region for a cooling air stream, a first cavity for guiding a first air stream and a second cavity for guiding a second air stream, wherein the first cavity and the second cavity are connected with the inlet region, an air guide element formed with an internal isolation channel is arranged between the first cavity and the second cavity, and the second cavity comprises a first channel region and a second channel region, wherein the first channel region is arranged adjacent to the first cavity and represents a transition from the inlet region to the second channel region, the second channel region is located on a side of the first cavity facing away from the inlet region, behind the first cavity, and the internal isolation channel is arranged between the first cavity and the second channel region, and wherein the internal isolation channel separates the first cavity from the second channel region.

10. The air guide shroud according to claim 9,
characterized in that the second air stream in the first channel region flows parallel to the first air stream in the first cavity, and the second air stream in the second channel region includes an angle between 90° and 180° with the first air stream in the first cavity.

11. The air guide shroud according to claim 9,
wherein the air guide element includes a portion without the internal isolation channel, and the portion without the internal isolation channel extends between the first channel region and the first cavity.

12. The air guide shroud according to claim 9,
wherein the air guide shroud is arranged on a system board and closed on a side opposite the system board.

* * * * *